United States Patent
Hande

(10) Patent No.: US 11,522,463 B2
(45) Date of Patent: Dec. 6, 2022

(54) SYSTEM AND METHOD TO EXTEND LOW LINE OPERATION OF FLYBACK CONVERTERS

(71) Applicant: HARMAN PROFESSIONAL, INC., Northridge, CA (US)

(72) Inventor: Abhiman Ananthakrishna Hande, Plano, TX (US)

(73) Assignee: Harman Professional, Inc., Northridge, CA (US)

( * ) Notice: Subject to any disclaimer, the term of this patent is extended or adjusted under 35 U.S.C. 154(b) by 66 days.

(21) Appl. No.: 17/182,965

(22) Filed: Feb. 23, 2021

(65) Prior Publication Data
US 2022/0271677 A1 Aug. 25, 2022

(51) Int. Cl.
| | |
|---|---|
| H02M 1/42 | (2007.01) |
| H02M 1/08 | (2006.01) |
| H02M 3/335 | (2006.01) |
| G01R 19/165 | (2006.01) |
| H03F 3/213 | (2006.01) |
| H02M 1/00 | (2006.01) |

(52) U.S. Cl.
CPC .. *H02M 3/33576* (2013.01); *G01R 19/16538* (2013.01); *H03F 3/213* (2013.01); *H02M 1/0003* (2021.05); *H02M 1/0058* (2021.05); *H03F 2200/03* (2013.01)

(58) Field of Classification Search
CPC .............................................. H02M 3/33576
See application file for complete search history.

(56) References Cited

U.S. PATENT DOCUMENTS

| | | | |
|---|---|---|---|
| 2011/0305048 A1 | 12/2011 | Yang et al. | |
| 2012/0250367 A1* | 10/2012 | Desimone | H02M 3/3381 363/21.17 |
| 2013/0147269 A1* | 6/2013 | Zimmermann | H05B 47/18 315/86 |
| 2013/0265023 A1* | 10/2013 | Schwartz | H02M 3/33515 323/282 |
| 2017/0302157 A1* | 10/2017 | Lin | H02M 3/33523 |

OTHER PUBLICATIONS

Anonymous: "LM5023 AC-DC Quasi-Resonant Current Mode PWM Controller", Jan. 31, 2016, pp. 1-38, URL:https://www.tij.co.jp/jp/lit/ds/symlink/lm5023.pdf?ts=1657728191072$ref_url=https%3A%2Fwww.google.com%2F.
Alinder, Terry: "LM5023-2EVM Notebook Adapter", Mar. 31, 2013, pp. 1-22, URL:https://www.ti.com/lit/an/snva686/snva686.pdf?ts=1657729221484&ref_url=https%3A%2F%2Fwww.ti.com%2Fproduct%2FLM5023.

(Continued)

*Primary Examiner* — Jared Fureman
*Assistant Examiner* — Esayas G Yeshaw
(74) *Attorney, Agent, or Firm* — Brooks Kushman, P.C.

(57) ABSTRACT

An amplifier system may include at least one input source, a flyback converter including a pair of complementary metal oxide silicon field effect transistor (MOSFETs), a controller integrated circuit (IC) having a quasi-resonant (QR) pin and configured to provide a biased drive current to the flyback converter, and a transition component arranged at the controller IC and configured to correct pulse width modulation at the IC to ensure the voltage at a transition pin of the IC is above a predefined threshold during a resonant transition.

16 Claims, 6 Drawing Sheets

(56) References Cited

OTHER PUBLICATIONS

King, Brian and O'Loughlin, Michael: "Power Supply Design Seminar: Common Mistakes in Flyback Power Supplies and How to Fix Them", Dec. 31, 2020, pp. 1-29, URL:https://www.ti.com/seclit/ml/slup392/slup392.pdf?ts=1603870799715.
Lee Jia-Hyun et al: "An Active Resonant Circuit with the Dynamic Resonant Period Control Technique for Fast Zero Voltage Switching in GaN-Based Active Clam Flyback Converters", 2019 IEEE International Symposium on Circuits and Ystems (ISCAS), IEEE, May 26, 2019, pp. 1-4.

* cited by examiner

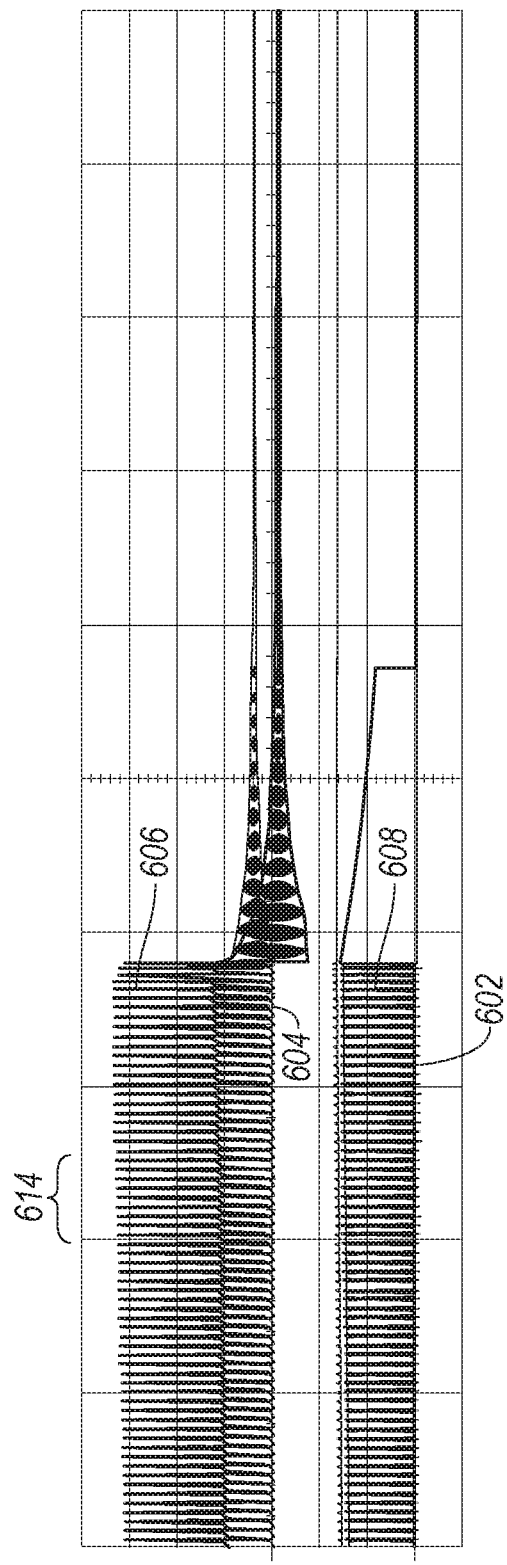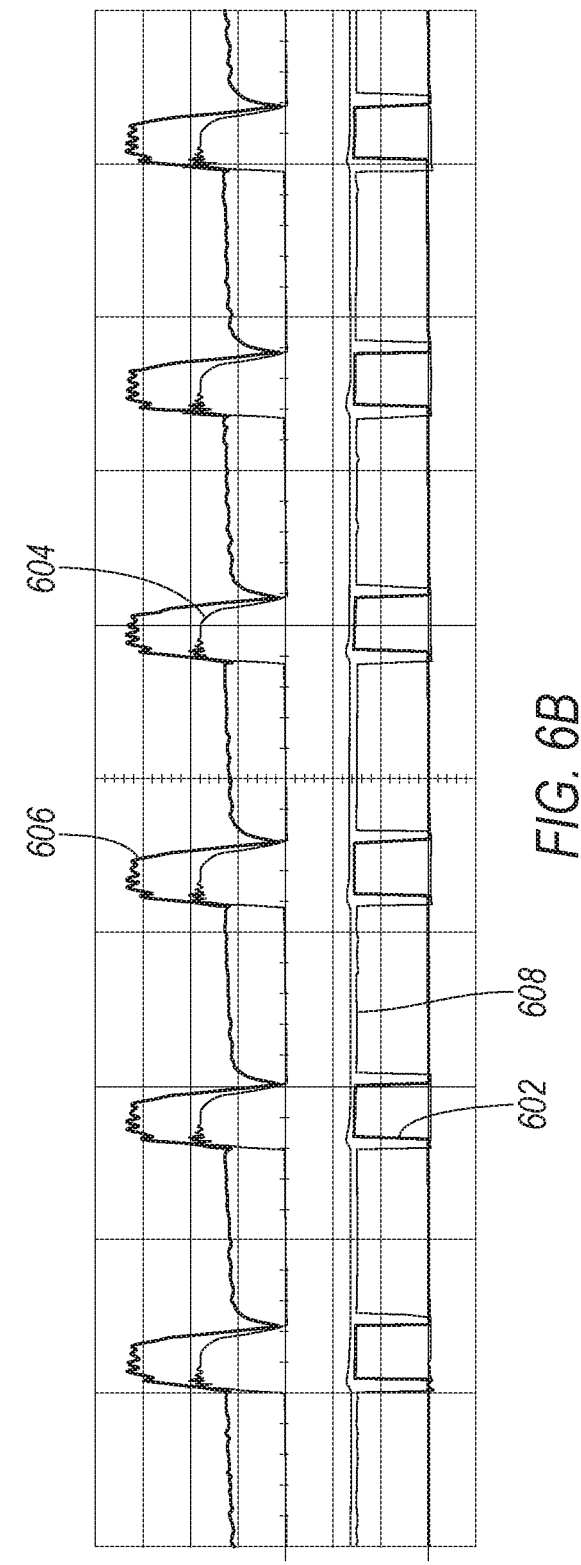

SYSTEM AND METHOD TO EXTEND LOW LINE OPERATION OF FLYBACK CONVERTERS

TECHNICAL FIELD

Disclosed herein are systems and methods to extend low line operation of flyback converters.

BACKGROUND

Audio amplifiers and other applications often employ flyback converters as a means to provide a bias supply to various circuits and integrated circuits (ICs) on the primary and secondary sides. These bias power supplies typically use off-the-shelf flyback controller ICs. To improve efficiency, quasi resonant and active clamp topology flyback converters are used as the bias supply. These controller ICs may require that the voltage on their quasi-resonant pin be high prior to a complementary metal oxide silicon field effect transistor (MOSFET) turning on. However, at low line when the system is off, the voltage at the ICs resonant pin may take a longer period of time to transition to a high level and can result in the main MOSFET switch turning on again after the IC's internal time out. This phenomenon can result in hard switching, ringing on the MOSFET's switch node, and even hard failure. Failure can lead to complete system shutdown due to lack of bias power.

SUMMARY

An amplifier system may include at least one input source, a flyback converter including a pair of complementary metal oxide silicon field effect transistor (MOSFETs), a controller integrated circuit (IC) having a quasi-resonant (QR) pin and configured to provide a biased drive current to the flyback converter, and a transition component arranged at the controller IC and configured to correct pulse width modulation at the IC to ensure the voltage at a transition pin of the IC is above a predefined threshold during a resonant transition.

An audio amplifier system employing flyback converters to provide a bias supply may include at least one input source, a flyback converter including a pair of complementary metal oxide silicon field effect transistor (MOSFETs), a controller integrated circuit (IC) having a quasi-resonant (QR) pin and configured to provide a biased drive current to the flyback converter, and a transition component arranged at the controller IC and configured to correct pulse width modulation at the IC to ensure the voltage at a transition pin of the IC is above a predefined threshold during a resonant transition.

An amplifier system may include at least one input source, a flyback converter including a pair of complementary field effect transistors (FETs), a controller integrated circuit (IC) having a quasi-resonant (QR) pin and configured to provide a biased drive current to the flyback converter, and a transition component arranged at the controller IC and configured to correct pulse width modulation at the IC to ensure the voltage at a transition pin of the IC is above a predefined threshold during a resonant transition, wherein the transition component is a DC offset arranged in series with the QR pin of the controller IC to offset the voltage above the predefined threshold.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like-referenced numerals designate corresponding parts throughout the different views.

FIG. 5 illustrates an example system diagram for a flyback converter (primary side) with a resistor added between the controller's QR and output pins that facilitates fast dv/dt transition at QR pin during main MOSFET turn on;

FIG. 6A illustrates example waveforms for the system of FIGS. 4 and 5 when the AC Line voltage is low (e.g., 50 Vrms); and FIG. 6B is a zoomed view of a portion of FIG. 6A.

DETAILED DESCRIPTION

Figure 1:
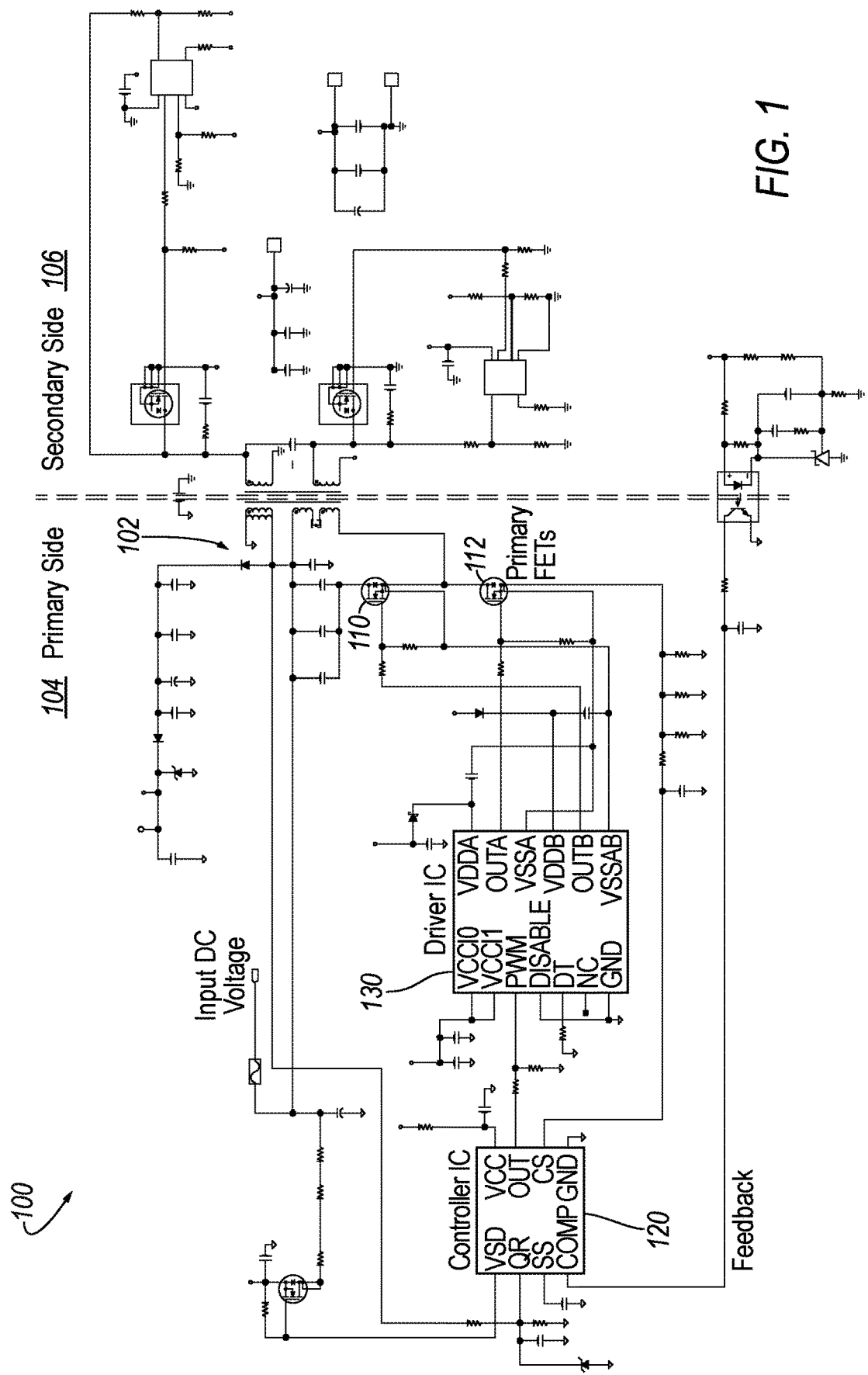
FIG. 1 illustrates an example circuit diagram for a flyback converter having a primary side and a secondary side.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Amplifiers, including Class D amplifiers, may use flyback converters to provide bias power to various circuits and ICs on the primary and secondary side of the system. These flyback power supplies typically use of the shelf controller ICs. To improve efficiency, quasi-resonant and active clamp topology flyback converters are used as the bias supply. Their controller IC's require that the voltage on their quasi-resonant pin go high prior to complementary MOSFET turn on. However, at low AC line and during system turn off, the voltage at the ICs resonant pin may take a longer period of time to transition to a high level and can result in the main MOSFET turning on again after the IC's internal time out. This may cause hard switching, ringing on the switch node, and semiconductor failure, leading to shutdown due the lack of bias power. Existing systems using universal AC inputs (85 Vrms-264 Vrms) ensure turn on and off at relatively higher AC voltages (e.g. >70 Vrms) to prevent system operation at lower AC input voltages.

Currently, AC/DC rectifiers with power factor correction (PFC) may include a boost converter for PFC. This converter regulates the DC bus typically at 400V and is used to provide DC voltage to the flyback converter input after system turn on instead of providing a rectified voltage directly from the AC mains. However, the issues still exist at turn on, as well as at turn off at low voltage levels.

Disclosed herein is a system that ensures appropriate pulse width modulation (PWM) pulses are obtained at low line and when the amplifier system is off by including a transition component. In one example, the transition component may be a DC offset included on the quasi-resonate (QR) pin of the controller IC in order to increase the amplitude of the voltage thereon. In another example, a resistor may be arranged between the QR pin and the output pin of the controller IC. The resistor adds DC offset and facilitates a fast voltage change transition at the QR pin during main MOSFET turn on.

These embodiments help prevent hard switching and potential semiconductor failure. Further, higher voltage rated components, such as capacitors and semiconductors, are not required, reducing system costs. With the addition of the DC Offset and/or resistor, the system may start up at lower AC line voltage resulting in a lower inrush current. Further, lower stresses on system components such as semi-conductors, at low AC line, increases efficiencies of the system in a cost-effective manner.

Figure 2:
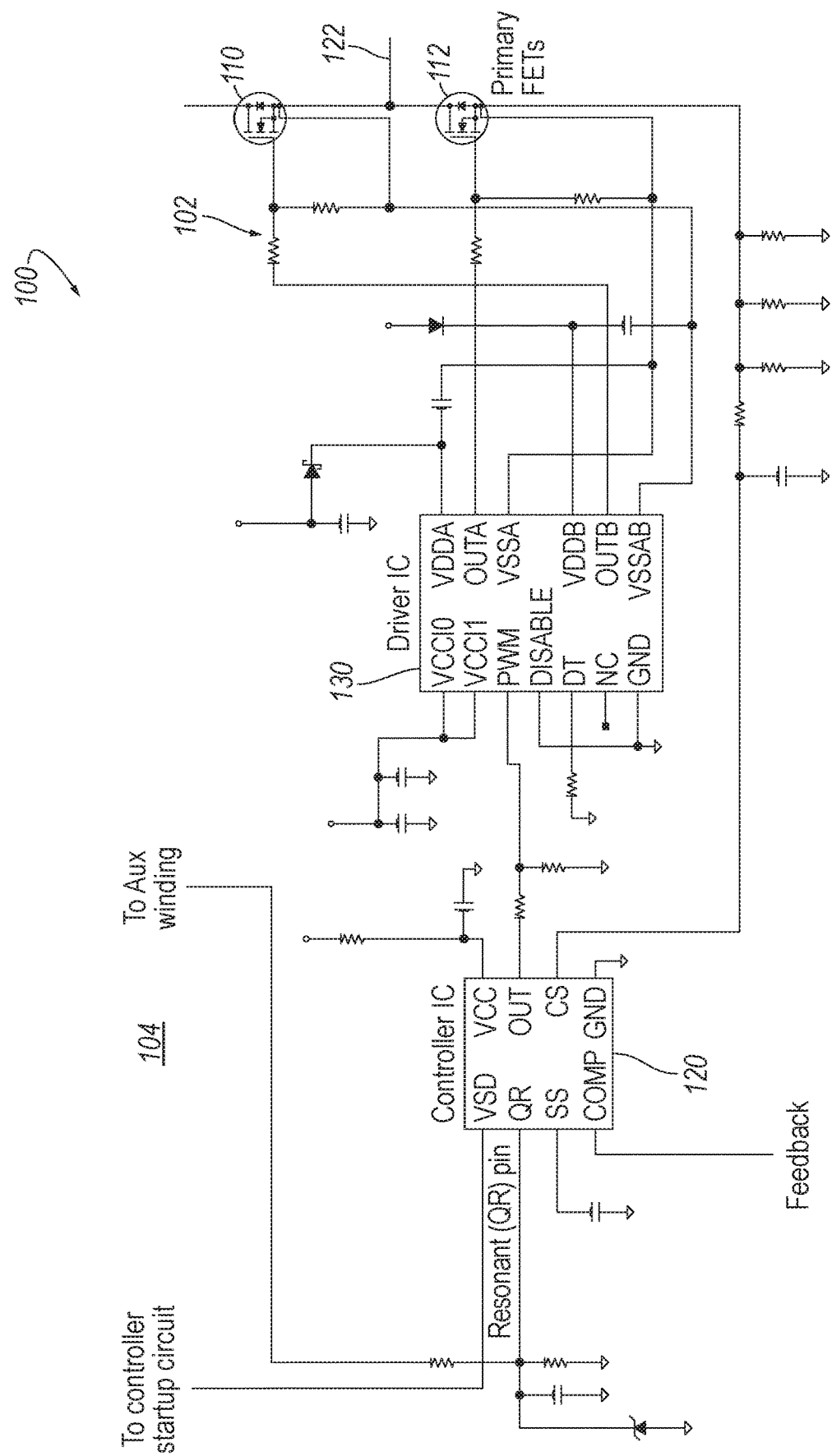
FIG. 2 illustrates the primary side of the system of FIG. 1.

FIG. 1 illustrates an example system diagram for an amplifier system 100 having a primary side 104 and a secondary side 106. A flyback converter 102 is arranged on the primary side 104 of the system 100. FIG. 2 illustrates the zoomed in primary side 104 of the system 100 of FIG. 1. Referring to both figures, the flyback converter 102 may include a pair of metal oxide silicon field effect transistors (MOSFETs) 110, 112 configured to require a high voltage at the flyback converter 102 prior to turning on. As is the case in a typical flyback system, the switching occurs at the primary side 104. The switch node 122 is arranged between the two MOSFETs 110, 112 as shown in FIG. 2.

The system 100 includes a controller IC 120. The IC 120 is illustrated as an eight-pin IC, but may include any number of pins (e.g., 16 pins, etc.). In this example, the IC 120 may include a quasi-resonant (QR) pin. The IC 120 includes a supply voltage $V_{CC}$ pin configured to turn on so long as the voltage at the pin is above a voltage threshold. The IC is disabled if the voltage at the Vcc pin falls below the threshold.

Other pins may include a soft start (SS) pin that charges and ramps up with an internal current generator. As the current ramps up, the current at a current sense (CS) pin increases linearly, affecting the duty cycle. The SS pin is discharged when the supply voltage at the $V_{CC}$ falls below the threshold. A COMP pin may activate a burst-mode operation if the pin recognizes a voltage below an internal threshold. The OUT pin of the IC 120 may transmit the PWM drive to a driver IC 130.

Figure 3A:
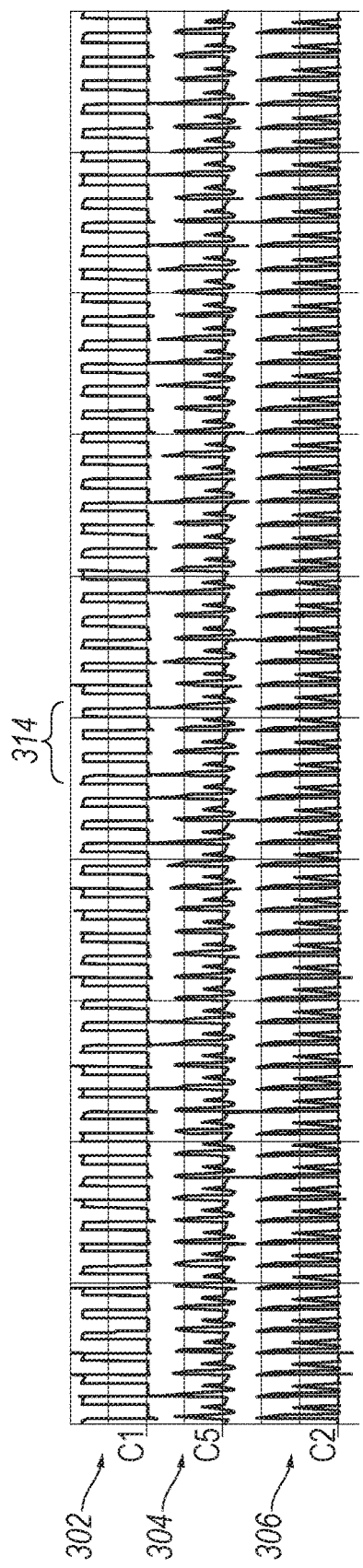
FIG. 3A illustrates example waveforms for the system of FIGS. 1 and 2 when the AC Line voltage is low (e.g., 50 Vrms)

FIG. 3A illustrates example waveforms for the system of FIGS. 1 and 2 when the AC line voltage is low (e.g., 50 Vrms). The first waveform 302 illustrates the gate-source voltage $V_{gs}$ of the MOSFET 112. The second waveform 304 illustrates the drain-source voltage $V_{ds}$ of the MOSFET 112. The third waveform 306 illustrates a QR voltage at the QR pin of the controller IC 120.

As illustrated, the drain-source voltage $V_{ds}$ peaks when the gate-source voltage $V_{gs}$ drops, with at least one intermittent peak while the gate-source voltage is low. The voltage at the QR pin of the controller IC 120 mimics the drain-source voltage $V_{ds}$ and peaks when the gate-source voltage $V_{gs}$ drops.

Figure 3B:
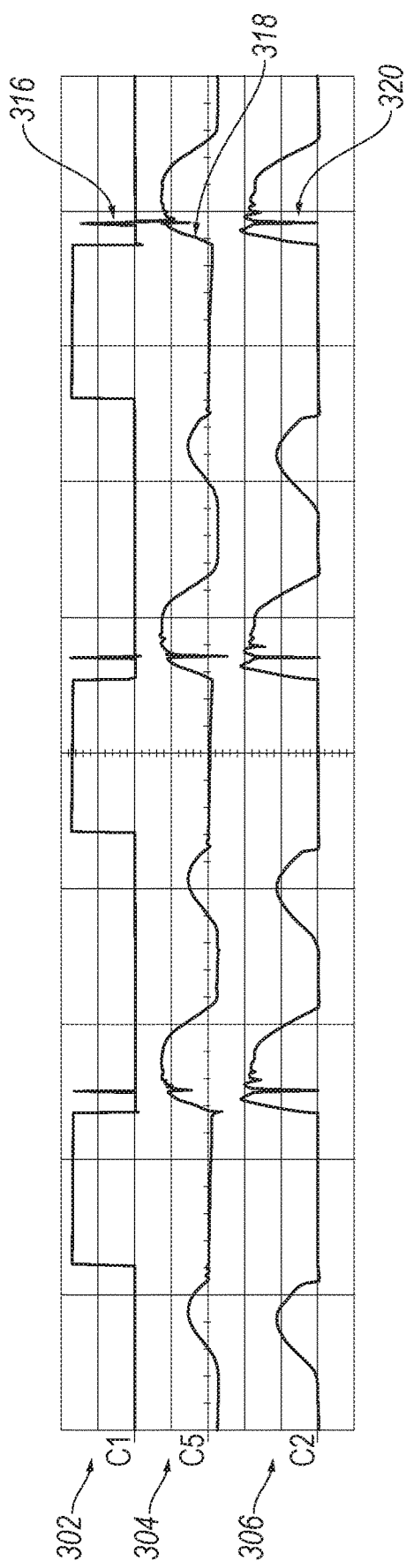
FIG. 3B is a zoomed view of a portion of FIG. 3A.

FIG. 3B is a zoomed view of portion 314 of FIG. 3A. The first waveform 302 illustrates the gate-source voltage $V_{gs}$ over time. As explained above, the complementary MOSFET 110, will turn on once the voltage at the QR pin of the controller IC 120 exceeds the threshold voltage. As shown in FIG. 3B, voltage is slow to exceed this threshold. This results in a bad $V_{gs}$ pulse as shown at 316 in FIG. 3B. This is due, at least in part, to the slow voltage change at the QR pin at low AC line, causing hard switching to occur for MOSFET 112 in FIG. 2.

The second waveform 304 illustrates the voltage over time at the controller QR pin at low AC line (e.g., less than 70 Vrms AC input). As illustrated, the change in voltage (dv/dt) is slow after the main MOSFET 112 turns OFF. The third waveform 306 illustrates the slow dv/dt change in voltage over time at the switch node 122 which is the same as the drain to source voltage ($V_{ds}$) of main MOSFET 112. This slow transition at the controller IC 120 QR pin, results in the main MOSFET 112 turning ON again as shown by the incorrect short $V_{gs}$ pulse 316 in FIG. 3B. Also, notice that this incorrect pulse results in hard switching at the switch node 122 as shown by the abrupt drop in main MOSFET 112 $V_{ds}$ voltage (switch node voltage) as shown at 320 in FIG. 3B. when the voltage meets the threshold.

Thus, the voltage at the ICs resonant pin for the systems in FIGS. 1 and 2 may take a longer period of time to transition to a high level and can result in the main MOSFET turning on again after the IC's internal time out. This may cause hard switching, ringing on the switch node, and semiconductor failure, leading to system shutdown due the lack of bias power. Existing systems may use universal AC inputs (85 Vrms-264 Vrms) to ensure turn on and off at relatively higher AC voltages (e.g. >70 Vrms) and to prevent system turn on at lower AC input voltages.

Figure 4:
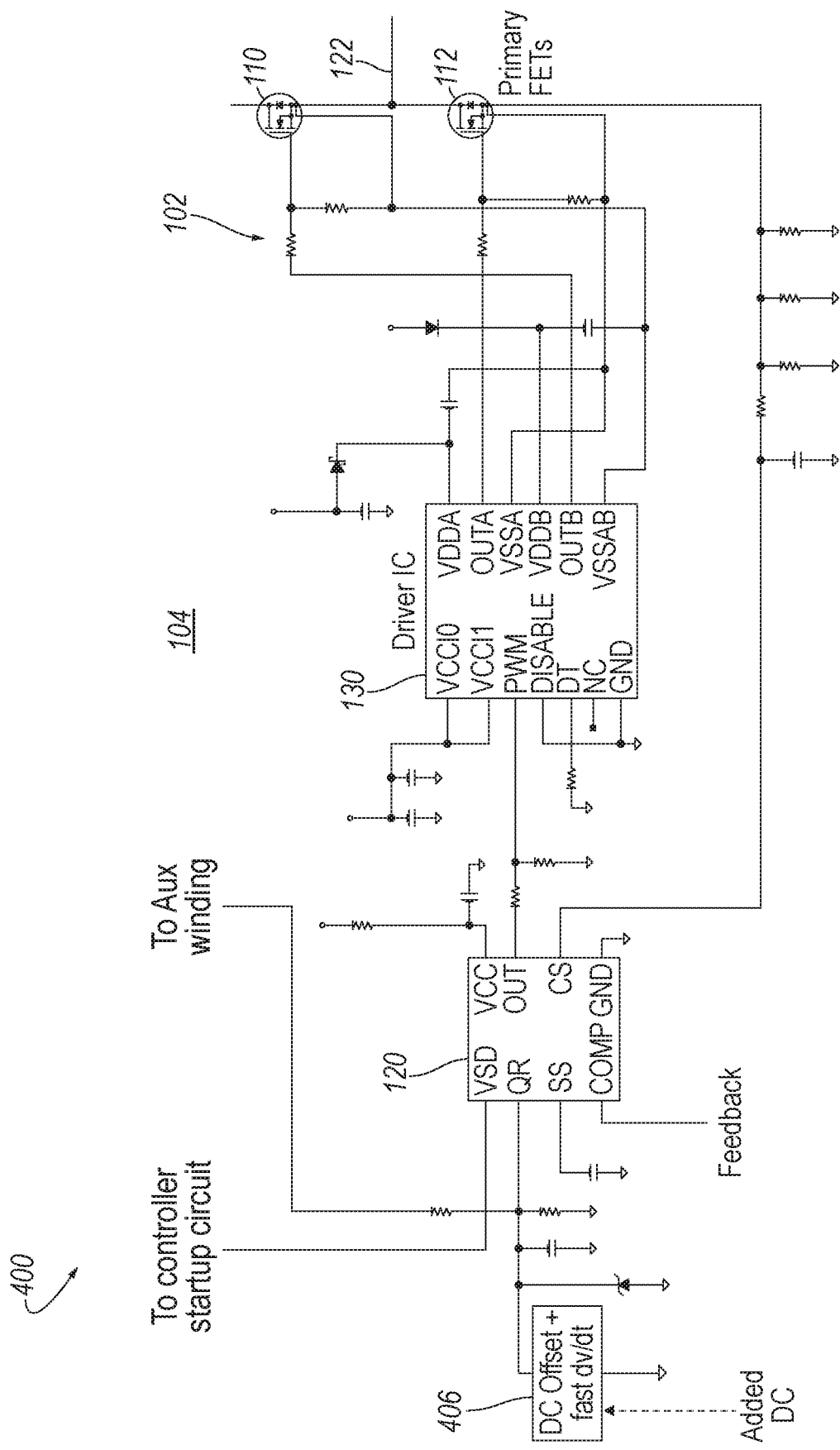
FIG. 4 illustrates an example circuit diagram for a flyback converter (primary side) with DC offset and fast dv/dt transition circuit added to the controller's QR pin.

FIG. 4 illustrates a zoomed in example system diagram for an amplifier system 400 having a flyback converter 102 arranged on the primary side 104 of the system 400. As explained above with respect to FIGS. 1 and 2, the flyback converter 102 includes a pair of field-effect transistor (MOSFETs) 110, 112 configured to require a high voltage at the flyback converter 102 prior to turning on. As is the case in a typical flyback system, the switching occurs at the primary side 104. The switch node 122, is arranged between the two MOSFETs 110, 112.

The system 400 includes a controller IC 120. In this example, the IC 120 may include the quasi-resonant (QR) pin and the supply voltage VCC pin configured to turn on so long as the voltage at the pin is above the threshold. The IC is disabled if the voltage at the VCC pin falls below the threshold. Other pins may include the soft start (SS) pin, the current sense (CS) pin, and the COMP pin, among others.

The system 400 may include a DC offset 406 arranged at the QR pin of the IC 120. The DC offset 406 may have a fast voltage change transition circuit. The DC offset, which is the amplitude displacement from zero, may allow for the correct PWM pulses to be obtained at the low AC line and during system turn off. This aids in preventing hard switching and potential semiconductor failure. By increasing the amplitude of the voltage at the QR pin, the transition between on and off may be slow, consistent, and less abrupt. Further, the IC 120 will not time out.

Figure 5:
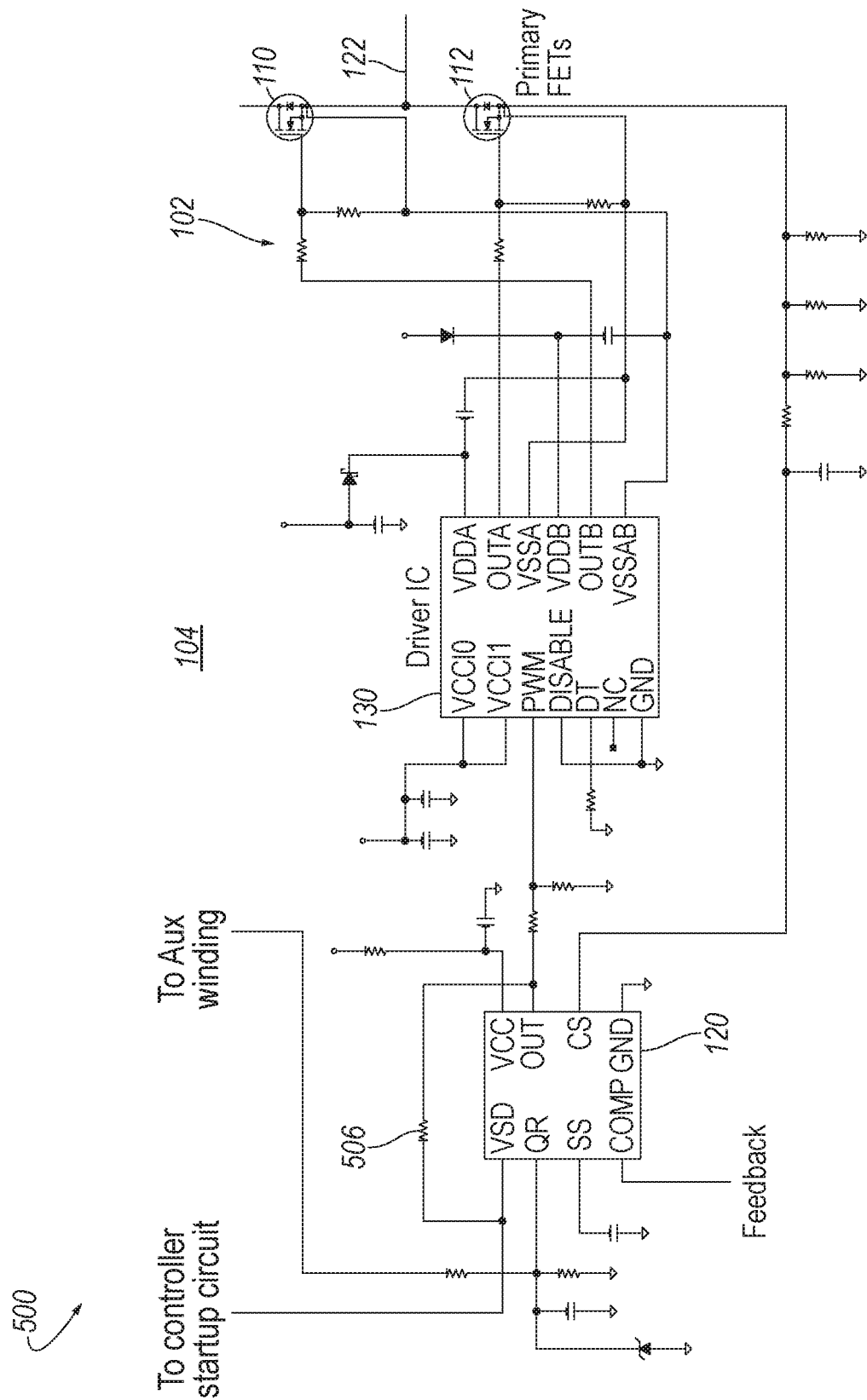

FIG. 5 illustrates a zoomed in example system diagram similar to FIG. 4 for an amplifier system 500 having the flyback converter 102 arranged on the primary side 104 of the system 500. As explained above with respect to FIG. 4, the flyback converter 102 includes a pair of metal oxide silicon field effect transistors (MOSFETs) 110, 112.

The system 500 includes a resistor 506 arranged between the IC's QR pin and the output pin. The resistor 506 may facilitate a DC offset and fast voltage change transition at the QR pin that prevents the incorrect rogue PWM turn on pulse for MOSFET 112. This prevents hard switching of the main MOSFET pulse.

FIG. 6A illustrates example waveforms for the system of FIGS. 4 and 5 when the AC line voltage is low (e.g., 50 Vrms) and after the use of a transition component such as the DC offset 406 and/or the resistor 506 of FIGS. 4 and 5 respectively. The first waveform 602 illustrates the drain-source voltage $V_{ds}$ of the main MOSFET 112. The second waveform 604 illustrates the gate-source voltage $V_{gs}$ of the main MOSFET 112. The third waveform 606 illustrates a QR voltage at the QR pin of the controller IC 120. The fourth waveform 608 illustrates the gate-source voltage $V_{gs}$ of the complementary MOSFET 110.

Similar to FIG. 3A, the drain-source voltage of MOSFET 112 starts going high after its gate-source voltage goes low. The voltage at the QR pin of the controller IC 120 mimics the drain-source voltage and starts going high when the gate-source voltage drops.

FIG. 6B is a zoomed view of portion 614 of FIG. 6A. Unlike the voltage at the QR pin shown in FIG. 3, the voltage is now greater than the controller IC QR pin threshold due to the added DC offset. There is no hard switching like the example in FIG. 3B, nor are there any inadvertent $V_{gs}$ pulses.

Thus, the voltage at the IC QR resonant pin for the systems in FIGS. 4 and 5 does not false trigger due to the added transition component (e.g., the DC offset 406 and/or the resistor 506). The $V_{gs}$ pulses are clean and alternating, allowing for smooth switching at the switch node.

The DC offset at the flyback controller's resonant pin allows the correct PWM pulses to be obtained at low AC line as well as during system turn off. The DC offset and resistor between the QR pin and output pin prevent hard switching and potential failure of semiconductors that can lead to shutdown due to a lack of bias power. Capacitors and semiconductors with higher voltage ratings are not required and allows for cost savings. Furthermore, components with higher voltage ratings have slower switching speeds which may contribute to additional system losses. The system described herein allows for startup at lower AC line voltages, resulting in lower inrush currents. The system also allows for a reduction of switching losses and reduction in electrical stress (e.g., overvoltage, switching losses, etc.) on the semiconductors at low AC line. This further adds to increasing the system's efficiencies.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable.

The flowcharts and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An amplifier system, comprising:
   at least one input source;

a flyback converter including a pair of complementary metal oxide silicon field effect transistor (MOSFETs);

a controller integrated circuit (IC) having a quasi-resonant (QR) pin and configured to provide a biased drive current to the flyback converter, and a transition component arranged at the controller IC and configured to correct pulse width modulation at the IC to ensure the voltage at a transition pin of the IC is above a predefined threshold during a resonant transition.

2. The system of claim 1, wherein the transition component is a DC offset arranged in series with the QR pin of the controller IC to offset the voltage above the predefined threshold.

3. The system of claim 1, wherein the transition component includes a resistor arranged between the QR pin and an output pin of the controller IC.

4. The system of claim 1, wherein the transition component is a fast voltage change transition circuit configured to correct PWM pulses to be obtained at a low current line.

5. The system of claim 1, wherein the transition component is a fast voltage change transition circuit configured to correct PWM pulses to be obtained when the system is off.

6. The system of claim 1, wherein the transition component increases the voltage amplitude at the QR pin to prevent hard switching.

7. An audio amplifier system employing flyback converters to provide a bias supply, comprising:

at least one input source;

a flyback converter including a pair of complementary metal oxide silicon field effect transistor (MOSFETs);

a controller integrated circuit (IC) having a quasi-resonant (QR) pin and configured to provide a biased drive current to the flyback converter, and a transition component arranged at the controller IC and configured to correct pulse width modulation at the IC to ensure the voltage at a transition pin of the IC is above a predefined threshold during a resonant transition.

8. The system of claim 7, wherein the transition component is a DC offset arranged in series with the QR pin of the controller IC to offset the voltage above the predefined threshold.

9. The system of claim 7, wherein the transition component includes a resistor arranged between the QR pin and an output pin of the controller IC.

10. The system of claim 7, wherein the transition component is a fast voltage change transition circuit configured to correct PWM pulses to be obtained at a low current line.

11. The system of claim 7, wherein the transition component is a fast voltage change transition circuit configured to correct PWM pulses to be obtained when the system is off.

12. The system of claim 7, wherein the transition component increases the voltage amplitude at the QR pin to prevent hard switching.

13. An amplifier system, comprising:

at least one input source;

a flyback converter including a pair of complementary field effect transistors (FETs);

a controller integrated circuit (IC) having a quasi-resonant (QR) pin and configured to provide a biased drive current to the flyback converter, and a transition component arranged at the controller IC and configured to correct pulse width modulation at the IC to ensure the voltage at a transition pin of the IC is above a predefined threshold during a resonant transition, wherein the transition component is a DC offset arranged in series with the QR pin of the controller IC to offset the voltage above the predefined threshold.

14. The system of claim 13, wherein the transition component is a fast voltage change transition circuit configured to correct PWM pulses to be obtained at a low current line.

15. The system of claim 13, wherein the transition component is a fast voltage change transition circuit configured to correct PWM pulses to be obtained when the system is off.

16. The system of claim 13, wherein the transition component increases the voltage amplitude at the QR pin to prevent hard switching.

* * * * *